United States Patent
Dupuis et al.

(10) Patent No.: US 6,897,730 B2
(45) Date of Patent: May 24, 2005

(54) METHOD AND APPARATUS FOR CONTROLLING THE OUTPUT POWER OF A POWER AMPLIFIER

(75) Inventors: Timothy J. Dupuis, Austin, TX (US); Ryan M. Bocock, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 23 days.

(21) Appl. No.: 10/378,779

(22) Filed: Mar. 4, 2003

(65) Prior Publication Data

US 2004/0174218 A1 Sep. 9, 2004

(51) Int. Cl.$^7$ .............................. H03F 3/04; H03G 3/20
(52) U.S. Cl. ...................................... 330/297; 330/129
(58) Field of Search ................................ 330/297, 296, 330/129

(56) References Cited

U.S. PATENT DOCUMENTS

| | | |
|---|---|---|
| 3,900,823 A | 8/1975 | Sokal et al. |
| 4,021,751 A | 5/1977 | Suzuki |
| 4,075,574 A | 2/1978 | Gilbert |

(Continued)

FOREIGN PATENT DOCUMENTS

| | | |
|---|---|---|
| DE | 4419318 | 7/1995 |
| EP | 399561 | 11/1990 |
| EP | 0413348 A2 | 2/1991 |
| EP | 0654898 A2 | 5/1995 |
| JP | 03128513 A | 5/1991 |
| JP | 63-7011 | 1/1998 |
| JP | 200074559 | 6/2000 |
| WO | WO 98/37627 | 8/1998 |
| WO | WO 00/16492 | 3/2000 |
| WO | WO03/017477 A2 | 2/2003 |
| WO | WO03/017477 A2 | 2/2003 |

OTHER PUBLICATIONS

Sokal, N. O. and Sokal, A. D., "Class E—A new class of high-efficiency tuned single ended switching power amplifiers," IEEE Journal of Solid State Circuits, vol. SC-10, No. 3, Jun. 1975, pp. 168-176.

Makihara, Chihiro et al., "The Possibility of High Frequency Functional Ceramics Substrate", International Symposium on Mulilayer Electronic Ceramic Devices, May 5, 1998 in Cincinnati, Ohio.

Huange et al., "A BiCMOS /Automatic Gain Control Amplifier for SONET OC-3", Proceeding of the IEEE Custom IC Conference, May 1–4, 1995, pp 103–106.

Webster, "Websters Ninth New Collegiate Dictionary", Merriam–Webster, 1991, p. 971.

Toffolo et al.. "Development of a CMOS switched capacitor instrumentation amplifier", IEEE Colloquium on ASICS, Apr. 10, 1992 p. 2/1.

Berglund. "A Note on Power-Law Devices and Their Effect on Signal-to-Noise Ratio", IEEE Transactions on Information Theory, vol. 10, Issue 1, Jan. 1964, p.p. 52–57.

G. Trauth V. Vanhuffel J. Trichet, "An Advanced Controller for Multi-Band Open Loop Power Control Mode RF Power Amplifier", Microwave Engineering, Jul. 2002. pp. 39–40.

(Continued)

*Primary Examiner*—Patricia Nguyen
(74) *Attorney, Agent, or Firm*—Johnson & Associates

(57) ABSTRACT

A method and apparatus is provided for use with a power amplifier to provide a regulated supply to the power amplifier. The invention uses a combination of voltage and current regulation to overcome the problems encountered in the prior art. In one example, voltage regulation is used at high power levels, while current regulation is used at low power levels.

41 Claims, 4 Drawing Sheets

U.S. PATENT DOCUMENTS

| | | |
|---|---|---|
| 4,165,493 A | 8/1979 | Harrington |
| 4,590,436 A | 5/1986 | Butler et al. |
| 4,604,532 A | 8/1986 | Gilbert |
| 4,649,467 A | 3/1987 | Vesce et al. |
| 4,772,856 A | 9/1988 | Nojima et al. |
| 4,808,907 A | 2/1989 | Main |
| 4,857,865 A | 8/1989 | Berman et al. |
| 4,893,030 A | 1/1990 | Shearer et al. |
| 4,990,803 A | 2/1991 | Gilbert |
| 5,023,566 A | 6/1991 | El-Hamamsy et al. |
| 5,118,997 A | 6/1992 | El-Hamamsy et al. |
| 5,274,341 A | 12/1993 | Sekine et al. |
| 5,291,123 A | 3/1994 | Brown |
| 5,298,811 A | 3/1994 | Gilbert |
| 5,327,337 A | 7/1994 | Cripe |
| 5,343,162 A | 8/1994 | Davis |
| 5,345,185 A | 9/1994 | Gilbert |
| 5,420,537 A | 5/1995 | Weedon et al. |
| 5,434,537 A | 7/1995 | Kukkonen |
| 5,450,036 A | 9/1995 | Nishioka et al. |
| 5,477,188 A | 12/1995 | Chawla et al. |
| 5,497,125 A * | 3/1996 | Royds ........................ 330/290 |
| 5,604,383 A | 2/1997 | Matsuzaki |
| 5,612,647 A | 3/1997 | Malec |
| 5,623,231 A | 4/1997 | Mohwinkel et al. |
| 5,625,205 A | 4/1997 | Kusama |
| 5,635,872 A | 6/1997 | Zimmerman |
| 5,646,578 A | 7/1997 | Loh et al. |
| 5,648,743 A | 7/1997 | Nagaya et al. |
| 5,726,603 A | 3/1998 | Chawla et al. |
| 5,742,205 A | 4/1998 | Cowen et al. |
| 5,789,984 A * | 8/1998 | Davis et al. ................. 330/279 |
| 5,831,331 A | 11/1998 | Lee |
| 5,834,978 A | 11/1998 | Cho |
| 5,867,061 A | 2/1999 | Rabjohn et al. |
| 5,880,635 A | 3/1999 | Satoh |
| 5,942,946 A | 8/1999 | Su et al. |
| 5,955,926 A | 9/1999 | Uda et al. |
| 5,969,582 A | 10/1999 | Boesch et al. |
| 5,973,368 A | 10/1999 | Pearce et al. |
| 5,974,041 A | 10/1999 | Kornfeld et al. |
| 5,986,500 A | 11/1999 | Park et al. |
| 6,008,698 A | 12/1999 | Dacus et al. |
| 6,011,438 A | 1/2000 | Kakuta et al. |
| 6,016,075 A | 1/2000 | Hamo |
| 6,047,167 A | 4/2000 | Yamashita |
| 6,047,168 A | 4/2000 | Carlsson |
| 6,069,528 A | 5/2000 | Kashima |
| 6,075,995 A | 6/2000 | Jensen |
| 6,133,793 A | 10/2000 | Lau et al. |
| 6,137,273 A | 10/2000 | Bales et al. |
| 6,147,511 A | 11/2000 | Patel et al. |
| 6,157,258 A | 12/2000 | Adishian et al. |
| 6,167,134 A | 12/2000 | Scott et al. |
| 6,181,207 B1 | 1/2001 | Chevallier et al. |
| 6,198,347 B1 | 3/2001 | Sander et al. |
| 6,203,516 B1 | 3/2001 | Kepley |
| 6,208,549 B1 | 3/2001 | Rao et al. |
| 6,208,875 B1 | 3/2001 | Damgaard et al. |
| 6,222,788 B1 | 4/2001 | Forbes et al. |
| 6,232,634 B1 | 5/2001 | Wu et al. |
| 6,236,271 B1 | 5/2001 | Vakilian |
| 6,265,939 B1 | 7/2001 | Wan et al. |
| 6,274,937 B1 | 8/2001 | Ahn et al. |
| 6,319,829 B1 | 11/2001 | Pasco et al. |
| 6,323,735 B1 | 11/2001 | Welland et al. |
| 6,362,606 B1 | 3/2002 | Dupuis et al. |
| 6,384,540 B1 | 5/2002 | Porter, Jr. et al. |
| 6,392,488 B1 | 5/2002 | Dupuis et al. |
| 6,407,639 B1 | 6/2002 | Jean et al. |
| 6,448,847 B1 | 9/2002 | Dupuis et al. |
| 6,462,620 B1 | 10/2002 | Dupuis et al. |
| 6,492,872 B1 | 12/2002 | Fujioka et al. |
| 6,549,071 B1 | 4/2003 | Paul et al. |
| 6,566,944 B1 * | 5/2003 | Pehlke et al. .................. 330/10 |
| 6,614,309 B1 * | 9/2003 | Pehlke ....................... 330/296 |
| 6,646,511 B2 | 11/2003 | Canyon et al. |
| 6,653,902 B1 * | 11/2003 | Bachhuber et al. ......... 330/285 |
| 6,677,821 B2 | 1/2004 | Kusunoki et al. |
| 2002/0044018 A1 | 4/2002 | Dupis et al. ................. 330/254 |

OTHER PUBLICATIONS

RF Micro Devices, Inc., RF3110 Triple–Band GSM/DCS/PCS Power AMP Module Data Sheet. pp. 2–401–2–412.

Webster, "Websters Ninth New Collegiate Dictionary", Merriam–Webster, 1991, p. 971.

Toffolo et al., "Development of a CMOS switched capacitor instrumentation amplifier", IEEE Colloquium on ASICS, Apr. 10, 1992 p. 21.

Berglund, "A Note on Power–Law Devices and Their Effect on Signal–to–Noise Ratio", IEEE Transactions on Information Theory. vol. 10, Issue 1, Jan. 1964, pp. 52–57.

* cited by examiner

METHOD AND APPARATUS FOR CONTROLLING THE OUTPUT POWER OF A POWER AMPLIFIER

CROSS REFERENCE TO RELATED APPLICATIONS

This application is related to Ser. No. 09/660,123, entitled "POWER AMPLIFIER CIRCUITRY AND METHOD USING AN INDUCTANCE COUPLED TO POWER AMPLIFIER SWITCHING DEVICES", by Susanne A. Paul et al. (pending), which is expressly incorporated by reference herein.

FIELD OF THE INVENTION

This invention relates to power amplifiers. In particular, this invention relates to techniques for controlling the output power of power amplifiers.

BACKGROUND OF THE INVENTION

In some applications utilizing power amplifiers, there is a need to vary the output power delivered to a load. For example, in a cell phone environment, it is desired to vary the output power of the cell phone based on various factors. For example, a base station may dictate the power level at which each cell phone should transmit (based on factors such as the physical distance from the base station, for example).

A standard method of controlling the output power of a power amplifier is to use a voltage regulator to regulate the battery or power supply voltage. Typical approaches to controlling the output power of a power amplifier use an "open loop" or a "closed loop" control technique. Closed loop techniques use an RF sensor, such as a directional coupler, to detect the power amplifier output power. The detected output power is used in a feedback loop to regulate the output power. "Open loop" techniques control the output power by regulating either the power supply voltage or power supply current used by the power amplifier. Open loop techniques are popular since open loop techniques do not have the loss and complexity associated with RF sensor elements.

Open loop techniques have several problems. For example, because output sensing is not used, components using open loop techniques suffer from inaccuracies and part-to-part variations. It would be desirable to use an open loop technique which achieves low thermal and minimal part-to-part variation.

FIGS. 1 and 2 show two prior art examples of open loop techniques for regulating the output power of a power amplifier. FIG. 1 is a schematic diagram showing an open loop voltage regulation technique. FIG. 1 shows a power amplifier 100 and a voltage regulator 102. The voltage regulator 102 is comprised of switching device M1, op-amp 104, and a feedback loop. The voltage regulator 102 provides a regulated voltage to the power amplifier 100, based on the voltage sensed and a desired power level indicated by an automatic power control signal $V_{APC}$. FIG. 2 is a schematic diagram showing an open loop current regulation technique. Like FIG. 1, FIG. 2 shows a power amplifier 100 and a voltage regulator 102. The voltage regulator 102 is comprised of switching device M1, op-amp 104, a current sense resistor R1, and a feedback loop. The voltage regulator 102 provides a regulated current to the power amplifier 100, based on the current sensed through resistor R1 and a desired power level indicated by power control signal $V_{APC}$.

In general, voltage regulation is preferred in an open loop design since voltage regulation does not suffer from the loss associated with a current sensing element, such as resistor R1 in FIG. 2. However, in many power amplifier designs, and especially in CMOS designs, voltage regulation can result in large thermal and part-to-part variations. These problems are caused in part by thermal voltage ($V_T$) variations in transistors, which result in large power variations at low power, when the regulated voltage is close to the thermal voltage ($V_T$) limit.

SUMMARY OF THE INVENTION

A circuit of the invention is provided for controlling the output power of a power amplifier comprising: a voltage sensor; a current sensor; and control circuitry coupled to the voltage sensor and the current sensor for controlling the output power of the power amplifier.

Another embodiment of the invention provides a power regulator for use with a power amplifier, the power regulator comprising: a voltage regulator; a current regulator; and control circuitry coupled to the voltage regulator and to the current regulator for regulating the output power of the power amplifier using the voltage regulator and the current regulator.

Another embodiment of the invention provides an integrated circuit comprising: a power amplifier; a voltage sensor; a current sensor; and control circuitry coupled to the voltage sensor and the current sensor for controlling the output power of the power amplifier using information from the voltage and current sensors.

Another embodiment of the invention provides a method of controlling the output power of a power amplifier comprising: providing a voltage regulator; providing a current regulator; and controlling the output power of a power amplifier using the voltage regulator at high power levels and using the current regulator at low power levels.

Another embodiment of the invention provides a method of controlling the output power of a power amplifier comprising: sensing current provided to the power amplifier; sensing voltage provided to the power amplifier; selectively using the sensed current and sensed voltage to control the output power of the power amplifier.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates an example of a typical application of the present invention. A power amplifier using the power control techniques of the present invention may be used with a wireless transmission system such as a wireless telephone or other device. In a wireless device such as a cellular telephone, the wireless device may include a transceiver, an antenna duplexer, and an antenna. Connected between the transceiver and the antenna duplexer is an RF power amplifier for amplifying signals for transmission via the antenna. In the case of a wireless telephone application, the invention may be applied to GSM, CDMA, PCS, DCS, etc., or other wireless systems. This is just one example of an application of a power amplifier utilizing the present invention. The invention may also be used in any other application requiring a power amplifier.

Generally, the present invention uses a combination of voltage and current regulation to regulate the output power of a power amplifier. In one example, voltage regulation is used at high power levels (i.e., a first output voltage range), while current regulation is used at low power levels (i.e., a first output voltage range).

Figure 3:
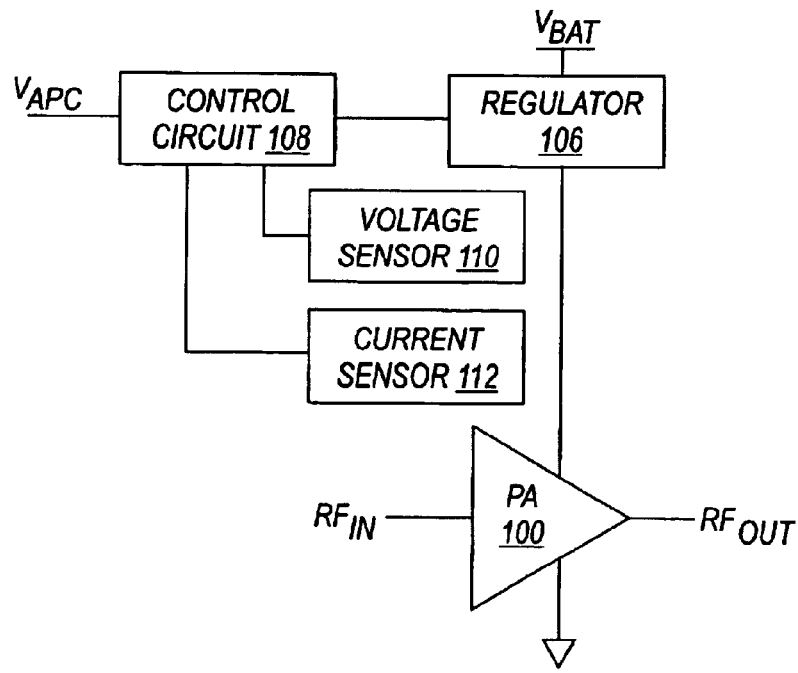
FIG. 3 is a block diagram of one example of a power regulation technique of the present invention.

FIG. 3 is a block diagram of one example of a power regulation technique of the present invention. FIG. 3 shows a power amplifier 100 and a regulator 106. Connected to the regulator 106 is a control circuit 108. The control circuit 108 is connected to a power control signal $V_{APC}$, a voltage sensor 110, and a current sensor 112. The control circuit 108 and regulator 106 control the output power of the power amplifier 100 based on the power control signal $V_{APC}$ and the sensed voltage and current. In one example, the power amplifier 100 is powered using voltage regulation at high power levels and current regulation at low power levels. In this example, at high power levels, the control circuit 108 and regulator 106 use the sensed voltage to regulate the output power of the power amplifier 100. At low power levels, the control circuit 108 and regulator 106 use the sensed current to regulate the output power of the power amplifier 100.

Figure 4:
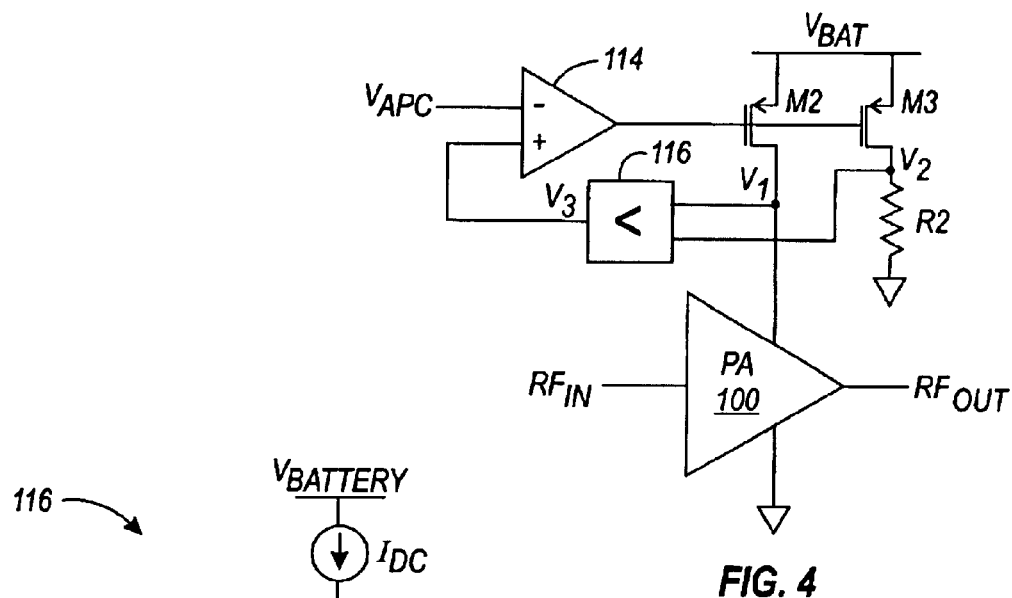
FIG. 4 is a schematic diagram illustrating one implementation of the present invention.

FIG. 4 is a schematic diagram illustrating one implementation of the circuit shown in FIG. 3. FIG. 4 shows an op-amp 114 with one input connected to $V_{APC}$ and a second input connected to the output $V_3$ of a less than block 116. One example of a less than block is described below with respect to FIG. 5. The less than block 116 has two inputs. A first input $V_1$ is connected to the node between the power amplifier 100 and a first switching device M2. A second input $V_2$ is connected to the node between a second switching device M3 and a current sense resistor R2. The voltage of the output $V_3$ of the less than block 116 will approximate the lesser of the inputs $V_1$ and $V_2$, as illustrated in the following equations:

$V_3=V_1$, when $V_1<V_2$; and $V_3=V_2$, when $V_2<V1$.

In the circuit shown in FIG. 4, switching devices M2 and M3 operate as a current mirror, with M3 being much smaller than M2. Resistor R2 is sized such that, at high power, switching device M3 will saturate and $V_2$ will be close to $V_{BAT}$. Therefore, $V_1$ will be less than $V_2$ at high power levels, and $V_3$ will be equal to $V_1$. With $V_3$ equal to $V_1$, the circuit operates as a voltage regulator (since the power amplifier is controlled by sensing the voltage at V1). At low power levels, $V_1$ becomes higher than $V_2$ due to the threshold voltage non-linearity of the power amplifier 100. Therefore, V3 will be equal to $V_2$ at low power levels. With $V_3$ equal to $V_2$, the circuit operates as a current regulator (since the power amplifier is controlled by sensing the current provided to resistor R2. In the embodiment described above, V3 approximates V1 or V2. In another example, V3 may not approximate V1 or V2, but is related to one or the other. For example, at high power levels, V3 can be proportional to V1 without approximating V1. Similarly, at low power levels, V3 can be proportional to V2 without approximating V2. Other embodiments are also possible.

Figure 5:
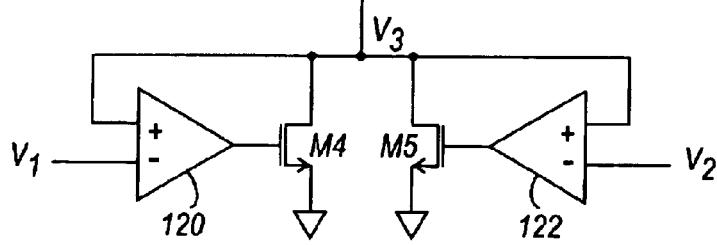
FIG. 5 is a schematic diagram of a less than circuit.

The less than block 116 shown in FIG. 4 can be implemented in any desired way. Following is a description of one example of a circuit for providing a less than function. FIG. 5 is a schematic diagram of a less than circuit 116. As mentioned above, the less than block 116 has an output $V_3$ that is approximately equal to the lesser of inputs $V_1$ and $V_2$. The implementation shown in FIG. 5 shows a first op-amp 120 having two inputs connected to $V_1$ and $V_3$. A second op-amp 122 has two inputs connected to $V_2$ and $V_3$. A DC current source $I_{DC}$ is also provided to $V_3$. The output of op-amp 120 is provided to a switching device M4, which is coupled between $V_3$ and a reference node (e.g., ground). The output of op-amp 122 is provided to a switching device M5, which is also coupled between $V_3$ and a reference node (e.g., ground). Op-amps 120 and 122, in combination with switching devices M4 and M5, are only capable of sinking current from $V_3$. When $V_1$ is greater than $V_2$ (at low power), the gate of switching device M4 is forced to ground and M4 turns off. $V_3$ is then equal to $V_2$. Similarly, when $V_2$ is greater than $V_1$ (at high power), the gate of switching device M5 is forced to ground and M5 turns off. $V_3$ is then equal to $V_1$. If $V_1$ and $V_2$ are equal, switching devices M4 and M5 will both be turned on and current from current source $I_{DC}$ will be split between them such that $V_3=V_1=V_2$.

Figure 1:
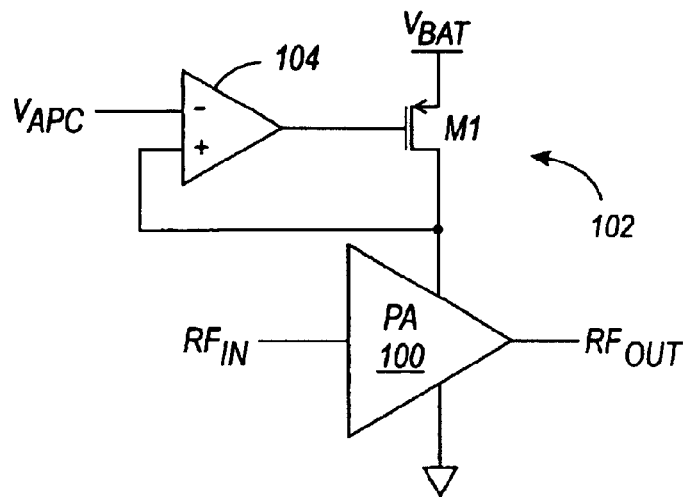
FIG. 1 is a schematic diagram showing an open loop voltage regulation technique.
Figure 2:
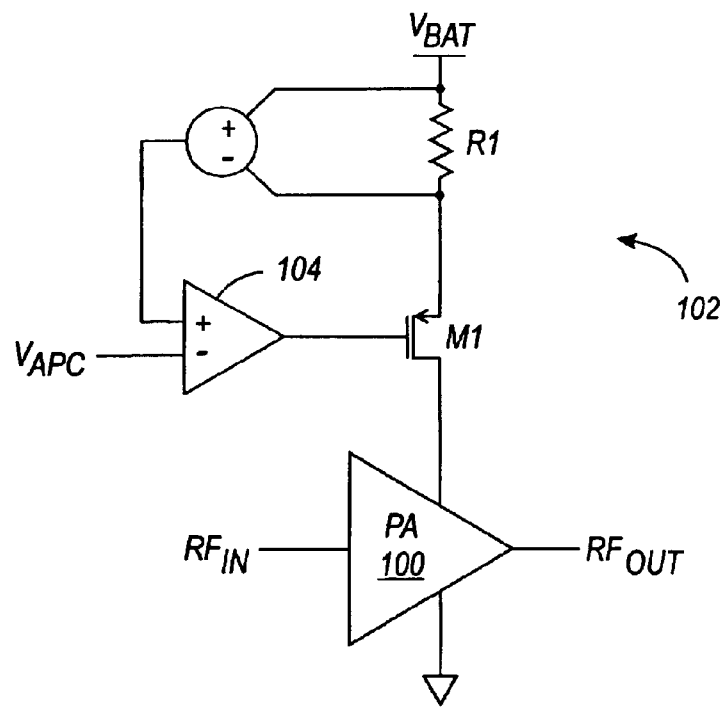
FIG. 2 is a schematic diagram showing an open loop current regulation technique.
Figure 6:
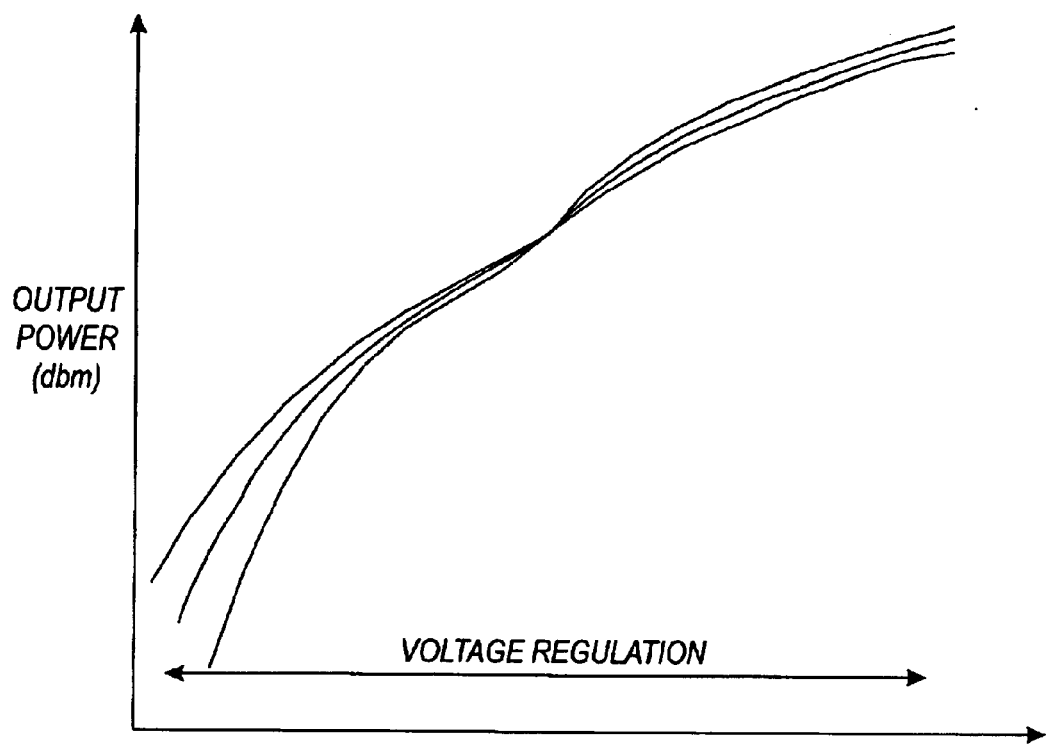
FIGS. 6 and 7 are plots illustrating the improved performance of the present invention.
Figure 7:
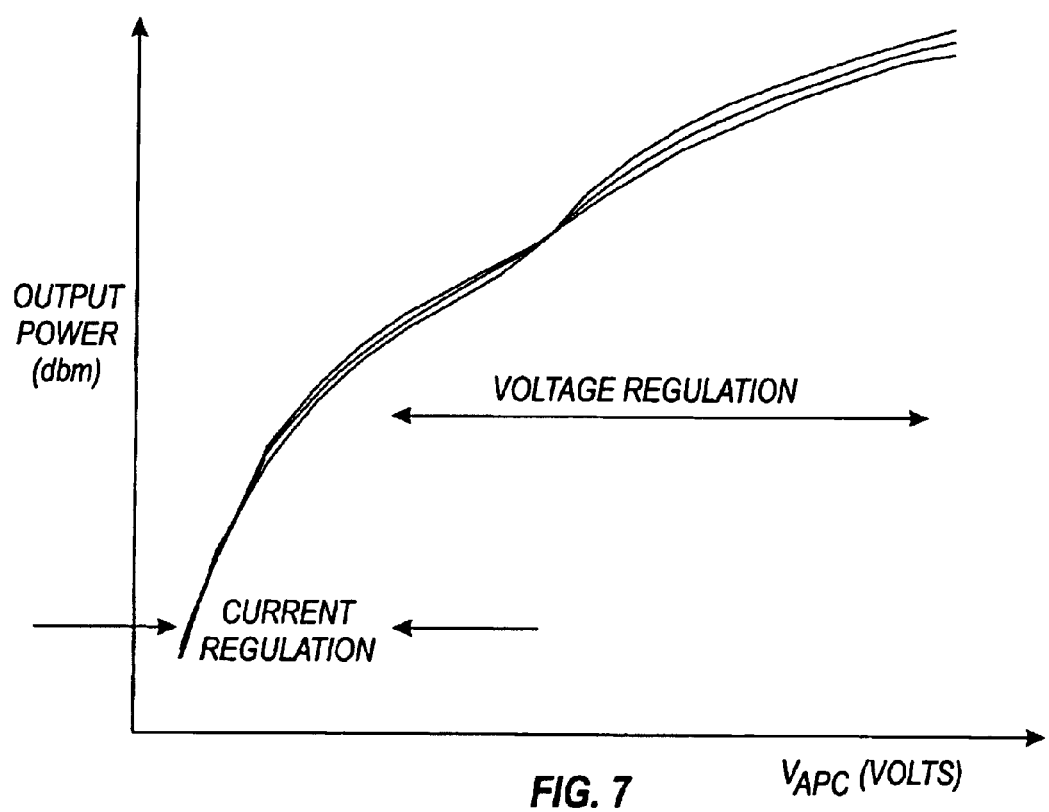

FIGS. 6 and 7 are plots illustrating the improved performance of the present invention. FIG. 6 is a plot of the output power (dbm) versus the voltage of a power control signal $V_{APC}$ at three different temperatures (e.g., high, nominal, and low temperatures) of a prior art power amplifier regulated by a voltage regulator (e.g., FIG. 1). As shown in FIG. 6, the output power variation is relatively small at higher power levels, but increases as the output power level decreases. Therefore, it can be seen that voltage regulation is satisfactory at high power levels, but is less reliable at low power levels.

The present invention takes advantage of the reliability of voltage regulation at high power levels, and the reliability of current regulation at low power levels. FIG. 7 is a plot similar to FIG. 6, illustrating the improvement provided by the present invention. At higher powr levels, voltage regulation is used, resulting in plots similar to those shown in FIG. 6. As the power decreases, the regulator of the present invention changes from a voltage regulator to a current regulator, thereby improving the output power variation for the three temperatures shown.

Figure 8:
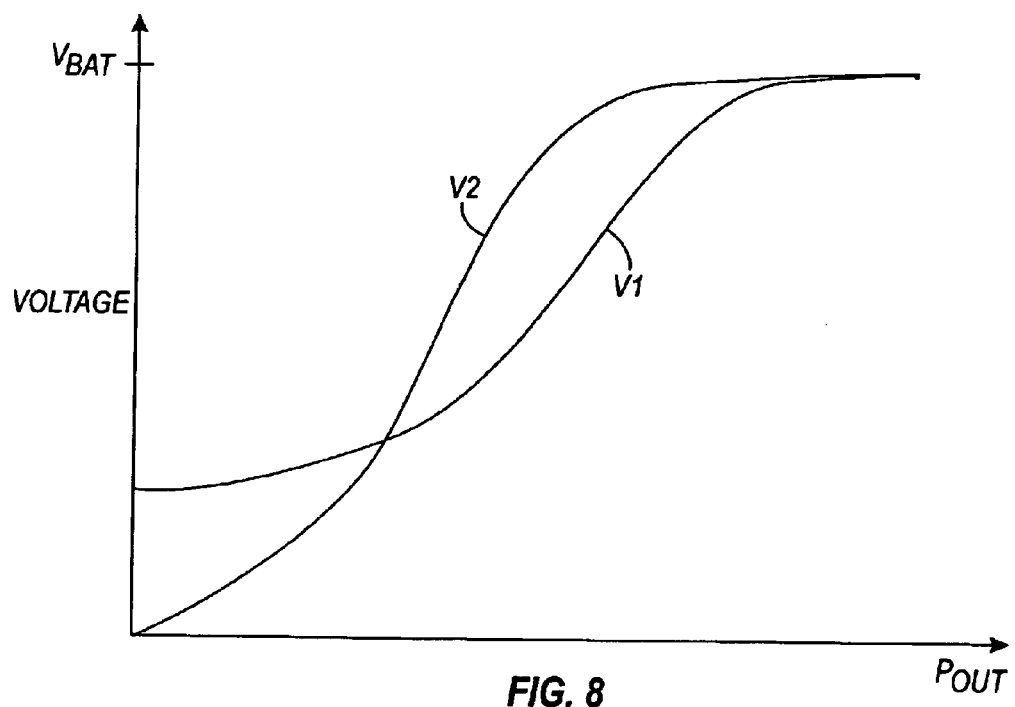
FIGS. 8 and 9 are timing diagrams illustrating the relationship between signals V1, V2 and V3.
Figure 9:
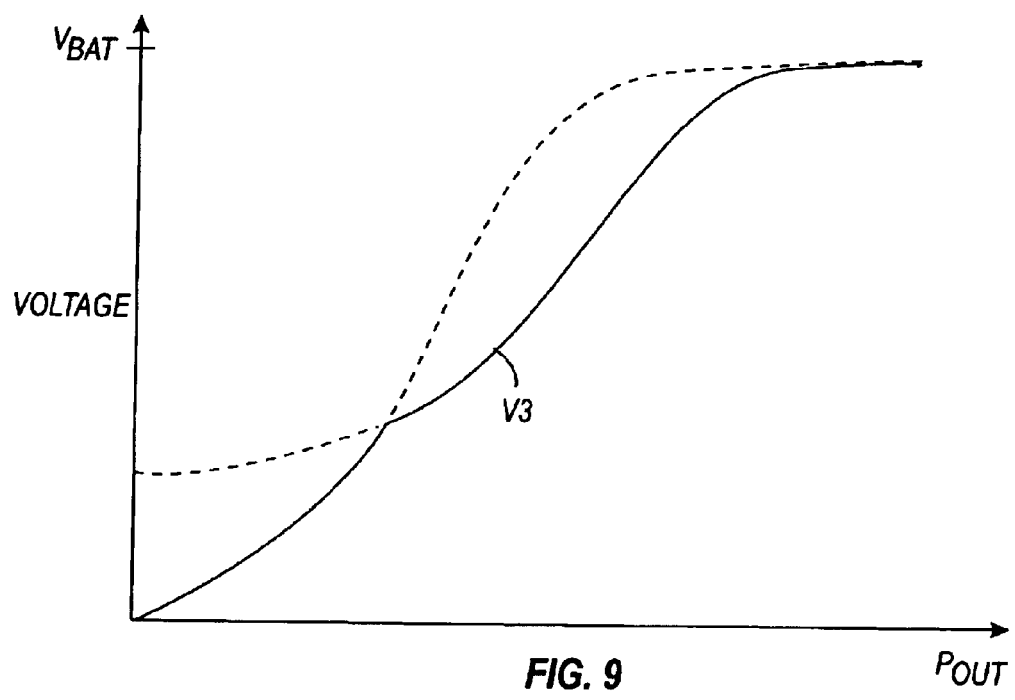

FIGS. 8 and 9 are timing diagrams illustrating the relationship between signals $V_1$, $V_2$ and $V_3$. FIG. 8 illustrates the voltage of signals $V_1$ and $V_1$ as a function of the output power ($P_{OUT}$) of the power amplifier. As shown, at higher power levels (the right portion of FIG. 8), $V_1$ is less than $V_2$. At lower power levels (the left portion of FIG. 8), $V_2$ is less than $V_1$. FIG. 9 illustrates the voltage of signal $V_3$ as a function of the output power ($P_{OUT}$) of the power amplifier. Since signal $V_3$ is equal to the lesser of $V_1$ and $V_2$, V3 is similar to $V_2$ at lower power levels and similar to V1 at higher power levels. The remaining portions of $V_1$ and $V_2$ are shown by dashed lines to help illustrate the relationship between $V_3$ and $V_1$ and $V_2$. At the point where the $V_1$ and $V_2$ plots cross, the power control technique of the present invention switches between current regulation and voltage regulation.

The present invention may be used in conjunction with any device requiring a regulated power supply, such as power amplifiers. The invention may be implemented in an integrated circuit (e.g., CMOS, etc.) or implemented using discrete components. If desired, the invention can be implemented in the same integrated circuit that contains the device requiring the regulated power (e.g., a power amplifier, etc.).

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit for controlling the output power of a power amplifier comprising:
    a voltage sensor;
    a current sensor;
    a resistive element, wherein the current sensor senses current through the resistive element;
    a switching device coupled between the resistive element and a voltage source; and
    control circuitry coupled to the voltage sensor and the current sensor for controlling the output power of the power amplifier.

2. The circuit of claim 1, further comprising:
    a voltage regulator; and
    a current regulator; and
    wherein the output power of the power amplifier is regulated using either the voltage regulator or the current regulator.

3. The circuit of claim 2, wherein the output power of the power amplifier is regulated using the voltage regulator at a first output power level range and using the current regulator at a second output power level range.

4. The circuit of claim 2, wherein the output power of the power amplifier is regulated using the voltage regulator at high output power levels and using the current regulator at low output power levels.

5. The circuit of claim 1, wherein the voltage sensor generates a first signal relating to the sensed voltage and the current sensor generates a second signal relating to the sensed current, and wherein the control circuitry uses the generated signals to control the output power of the power amplifier.

6. The circuit of claim 5, wherein the control circuitry uses the generated signal with the lesser voltage level to control the output power of the power amplifier.

7. The circuit of claim 5, wherein the control circuitry uses the first signal to control the output power of the power amplifier at high power levels.

8. The circuit of claim 7, wherein the control circuitry uses the second signal to control the output power of the power amplifier at low power levels.

9. The circuit of claim 5, wherein the control circuitry generates a third signal based on the first and second signals.

10. The circuit of claim 9, wherein the third signal approximates the first signal over a first output power level range and approximates the second signal over a second output power level range.

11. The circuit of claim 1, further comprising a switching device coupled between a voltage source and the power amplifier, wherein the voltage sensor senses a voltage present between the power amplifier and the switching device.

12. A power regulator for use with a power amplifier, the power regulator comprising:
    a voltage sensor, wherein the voltage sensor generates a first signal;
    a voltage regulator;
    a current sensor, wherein the current sensor generates a second signal;
    a current regulator; and
    control circuitry coupled to the voltage regulator and to the current regulator for regulating the output power of the power amplifier using the voltage regulator and the current regulator, wherein the control circuitry uses either the first or second signals at any one time to control the output power of the power amplifier, wherein the control circuitry uses the signal having the lower voltage level to control the output power of the power amplifier, and wherein the control circuitry uses the first signal to control the output power of the power amplifier during high power levels and the second signal to control the output power of the power amplifier during low power levels.

13. The power regulator of claim 12, wherein the control circuitry uses the voltage regulator during a first output power range, and uses the current regulator during a second output power range.

14. The power regulator of claim 12, wherein the control circuitry uses the voltage regulator at high output power levels, and uses the current regulator at low output power levels.

15. The power regulator of claim 12 wherein the control circuitry regulates the output power of the power amplifier based on voltage sensed by the voltage sensor and current sensed by the current sensor.

16. The circuit of claim 12 wherein the control circuitry uses the first signal to control the output power of the power amplifier during high power levels and the second signal to control the output power of the power amplifier during low power levels.

17. An integrated circuit comprising:
    a power amplifier;
    a voltage sensor, wherein the voltage sensor generates a first signal relating to the sensed voltage;
    a current sensor, wherein the current sensor generates a second signal relating to the sensed current; and
    control circuitry coupled to the voltage sensor and the current sensor for controlling the output power of the power amplifier using information from the voltage and current sensors, wherein the control circuitry uses the generated signals to control the output power of the power amplifier, and wherein the control circuitry uses the generated signal with the lesser voltage level to control the output power of the power amplifier.

18. The integrated circuit of claim 17 wherein the control circuitry uses the first signal to control the output power of the power amplifier at high power levels.

19. The integrated circuit of claim 18, wherein the control circuitry uses the second signal to control the output power of the power amplifier at low power levels.

20. A method of controlling the output power of a power amplifier comprising:

providing a voltage sensor to generate a first signal;

providing a voltage regulator;

providing a current sensor to generate a second signal;

providing a current regulator; and controlling the output power of the power amplifier using either the first or second signals, wherein the output power is controlled using the signal having the lower voltage level, and wherein the output power is controlled using the voltage regulator at high power levels and using the current regulator at low power levels.

21. A circuit for controlling the output power of a power amplifier comprising:

a voltage sensor, wherein the voltage sensor generates a first signal relating to the sensed voltage;

a current sensor, wherein the current sensor generates a second signal relating to the sensed current; and control circuitry coupled to the voltage sensor and the current sensor for controlling the output power of the power amplifier, wherein the control circuitry uses the generated signals to control the output power of the power amplifier, and wherein the control circuitry uses the generated signal with the lesser voltage level to control the output power of the power amplifier.

22. The circuit of claim 21, further comprising:

a voltage regulator; and a current regulator; and wherein the output power of the power amplifier is regulated using either the voltage regulator or the current regulator.

23. The circuit of claim 22, wherein the output power of the power amplifier is regulated using the voltage regulator at a first output power level range and using the current regulator at a second output power level range.

24. The circuit of claim 22, wherein the output power of the power amplifier is regulated using the voltage regulator at high output power levels and using the current regulator at low output power levels.

25. The circuit of claim 21, wherein the control circuitry uses the first signal to control the output power of the power amplifier at high power levels.

26. The circuit of claim 25, wherein the control circuitry uses the second signal to control the output power of the power amplifier at low power levels.

27. The circuit of claim 21, wherein the control circuitry generates a third signal based on the first and second signals.

28. The circuit of claim 27, wherein the third signal approximates the first signal over a first output power level range and approximates the second signal over a second output power level range.

29. The circuit of claim 21, further comprising a switching device coupled between a voltage source and the power amplifier, wherein the voltage sensor senses a voltage present between the power amplifier and the switching device.

30. The circuit of claim 21, further comprising a resistive element, wherein the current sensor senses current through the resistive element.

31. The circuit of claim 30, further comprising a switching device coupled between the resistive element and a voltage source.

32. A circuit for controlling the output power of a power amplifier comprising:

a voltage sensor, wherein the voltage sensor generates a first signal relating to the sensed voltage;

a current sensor, wherein the current sensor generates a second signal relating to the sensed current; and control circuitry coupled to the voltage sensor and the current sensor for controlling the output power of the power amplifier, wherein the control circuitry uses the generated signals to control the output power of the power amplifier, wherein the control circuitry generates a third signal based on the first and second signals, and wherein the third signal approximates the first signal over a first output power level range and approximates the second signal over a second output power level range.

33. The circuit of claim 32, further comprising:

a voltage regulator; and a current regulator; and wherein the output power of the power amplifier is regulated using either the voltage regulator or the current regulator.

34. The circuit of claim 33, wherein the output power of the power amplifier is regulated using the voltage regulator at a first output power level range and using the current regulator at a second output power level range.

35. The circuit of claim 33, wherein the output power of the power amplifier is regulated using the voltage regulator at high output power levels and using the current regulator at low output power levels.

36. The circuit of claim 32, wherein the control circuitry uses the generated signal with the lesser voltage level to control the output power of the power amplifier.

37. The circuit of claim 32, wherein the control circuitry uses the first signal to control the output power of the power amplifier at high power levels.

38. The circuit of claim 37, wherein the control circuitry uses the second signal to control the output power of the power amplifier at low power levels.

39. The circuit of claim 32, further comprising a switching device coupled between a voltage source and the power amplifier, wherein the voltage sensor senses a voltage present between the power amplifier and the switching device.

40. The circuit of claim 32, further comprising a resistive element, wherein the current sensor senses current through the resistive element.

41. The circuit of claim 40, further comprising a switching device coupled between the resistive element and a voltage source.

* * * * *